United States Patent [19]
Cheek et al.

[11] Patent Number: 6,074,906
[45] Date of Patent: *Jun. 13, 2000

[54] COMPLEMENTARY METAL-OXIDE SEMICONDUCTOR DEVICE HAVING SOURCE/DRAIN REGIONS FORMED USING MULTIPLE SPACERS

[75] Inventors: Jon Cheek, Round Rock; Derick J. Wristers; H. Jim Fulford, both of Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/958,534

[22] Filed: Oct. 27, 1997

[51] Int. Cl.$^7$ ................................. H01L 21/8238
[52] U.S. Cl. .................... 438/231; 438/232; 438/306; 438/307
[58] Field of Search .................. 438/230, 231, 438/232, 303, 305, 306, 307

[56] References Cited

U.S. PATENT DOCUMENTS

| | | | |
|---|---|---|---|
| 5,650,341 | 7/1997 | Yang et al. | 437/34 |
| 5,827,747 | 10/1998 | Wang et al. | 438/199 |
| 5,849,616 | 12/1998 | Ogoh | 438/231 |

OTHER PUBLICATIONS

S. Wolf and R.N. Tauber, Silicon Processing for the VLSI Era, vol. 1, Lattice Press, p. 408, 1986.

Wolf, S., *Silicon Processing for the VLSI Era, vol. 2—Process Integration*, Lattice Press, Sunset Beach, CA 90742 (1990); pp. 354–363 (ISBN 0–961672–4–5).

*Primary Examiner*—Donald L. Monin, Jr.
*Assistant Examiner*—Hoai Pham

[57] ABSTRACT

A CMOS semiconductor device having NMOS source/drain regions formed using multiple spacers has at least one NMOS region and at least one PMOS region. A first n-type dopant is selectively implanted into an NMOS active region of the substrate adjacent a NMOS gate electrode to form a first n-doped region in the NMOS active region. A first NMOS spacer is formed on a sidewall of the NMOS gate electrode and a first PMOS spacer on a sidewall of a PMOS gate electrode. A second n-type dopant is selectively implanted into the NMOS active region using the first NMOS spacer as a mask. A p-type dopant is selectively implanted into a PMOS active region using the first PMOS spacer as a mask to form a first p-doped region in the PMOS active region. A second NMOS spacer and a second PMOS spacer are formed adjacent the first NMOS spacer and first PMOS spacer, respectively. A third n-type dopant is selectively implanted into the NMOS active region using the second NMOS spacer as a mask to form a third n-doped region deeper than the second n-doped region in the NMOS active region. A second p-type dopant is selectively implanted into the PMOS active region using the second PMOS spacer as a mask to form a second p-doped region in the PMOS active region deeper than the first p-doped region.

18 Claims, 5 Drawing Sheets

COMPLEMENTARY METAL-OXIDE SEMICONDUCTOR DEVICE HAVING SOURCE/DRAIN REGIONS FORMED USING MULTIPLE SPACERS

FIELD OF THE INVENTION

The present invention is directed generally to semiconductor devices and, more particularly, to fabrication of complementary metal-oxide semiconductor (CMOS) devices having source/drain regions formed using multiple spacers.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modern electronic circuits. Thus, such circuits realize improved performance and lower costs as the performance of the MOS transistor is increased and as the manufacturing costs thereof are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent the gate electrodes by heavily doping the regions with a dopant of a desired conductivity. The conductivity of the doped region depends on the type of impurity used to dope the region. The typical MOS transistor is symmetrical, which means that the source and drain are interchangeable. Whether a region acts as a source or drain typically depends on the respective applied voltages and the type of device being made. The collective term source/drain region is used herein to generally describe an active region used for the formation of either a source or drain.

A channel region is formed in the semiconductor substrate beneath the gate electrode and between the source and drain regions. The channel is typically lightly doped with a dopant having a conductivity type opposite to that of the source and drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to controls the current flow through the channel region. This type of device is commonly referred to as a MOS field-effect-transistor (MOSFET).

MOS devices typically fall in one of two groups depending the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

Historically, only one type of device would be fabricated on a single wafer (i.e., only a single technology such as NMOS or PMOS would be used). As larger numbers of devices were formed on a wafer, increases in power density and dissipation inhibited the ability to use only a single technology. In response, complementary MOS (CMOS) technology was developed using both PMOS and NMOS transistors fabricated in a single substrate. While use of CMOS technology solves a number of problems, the technology is significantly more complex with respect to device physics. Moreover, since different types of dopants are being used, the complexity and cost of the fabrication process are both increased. For example, different masking and implantation steps are typically required to form doped regions for each type of dopant in the substrate.

A number of different techniques and fabrication processes may be used to form CMOS devices. With reference to FIGS. 1A–1E, one typical CMOS fabrication process will be described. The process depicted is used to form semiconductor structures having lightly doped drain (LDD) regions within the source and drain structures. As is well known, LDD structures are used in the formation of semiconductor devices having short channels in order to overcome problems associated therewith.

As depicted in FIG. 1A, a substrate 101 is divided into two device regions 101A and 101B. The two device regions 101A and 101B are of different conductivity types (n-channel and p-channel, respectively, in the illustrated embodiment) and are used to form the CMOS structures thereon. Different techniques may be used to form the two device regions 101A and 101B. The regions may be formed using an n-well in a p-type substrate, a p-well in an n-type substrate, twin wells in either an n- or p-type of substrate, etc. On the surface of the substrate 101, a field oxide, such as $SiO_2$, is generally provided to isolate the surface of the two device regions 101A and 101B. One or more gate electrodes 103 are formed on each of the device regions 101A and 101B. In the illustrated example, one gate electrode 103A is formed on the device region 101A and one gate electrode 103B is formed on the device region 101B.

An LDD region in the n-channel device region is first formed by masking the p-channel device region 101B with a mask layer 105 and implanting a relatively low dose of an n-type dopant 107 into the exposed areas to form lightly doped regions 109 as illustrated in FIG. 1A. A second mask 111 is formed over the n-channel device region 101A and a p-type dopant 113 is implanted into the p-channel device region 101B to form lightly doped p-type regions 115 in the substrate adjacent the gate electrode 103B.

Following the LDD implants, a spacer layer is formed and etched to form spacers 117 on sidewalls of the gate electrodes 103A and 103B. The p-channel device region 101B is again masked with a mask layer 119 and a heavy dose of an n-type dopant 121 is implanted into the substrate aligned with the spacers 117A to form heavily doped n-type regions 118A, as illustrated in FIG. 1C. In this manner, LDD structures 123A are formed in the substrate as illustrated in FIG. 1C.

In a manner similar to the n-channel region, the p-channel device region 101B is then exposed while masking the n-channel device region 101A with a mask layer 125. A high dose of a p-type dopant 118 is implanted into the substrate using spacers 117B for alignment to form heavily doped p-type regions 118B. In this manner, LDD structures 127B are also formed in the p-channel device region 101B.

Following formation of the LDD structures, the mask 125 is typically removed and further processing such as silicidation and interconnect formation is performed. The resulting structure is depicted in FIG. 1E. A more detailed description of the elements and fabrication of LDD source/drain regions may be found in S. Wolf, *Silicon Processing for the VLSI Era*, Vol. 2: Processing Integration, pp. 354–363.

As noted above, the use of different types of dopants significantly increases the complexity of CMOS technology. For example, p-type dopants, such as boron, typically diffuse more rapidly in silicon than n-type dopants, such as arsenic. This places constraints on the heat treatment of the device and reduces the ability to control the profiles of source/drain regions.

The formation of LDD regions in CMOS devices further increases the complexity of fabricating CMOS devices. For example, the heavily doped n-type and p-type regions 118A and 118B must have adequate conductity for device performance and sufficient depth to allow the formation of a silicide layer. Using the above conventional techniques to provide adequate conductivity and depth can cause excessive lateral diffusion of the heavily-doped n-type and p-type regions. This excessive lateral diffusion can in some instances overlap the lightly-doped n-type and p-type regions 109 and 115 and reduce the effective channel length.

SUMMARY OF THE INVENTION

A CMOS semiconductor device having an NMOS source/drain region formed using multiple spacers and a process for fabricating such as device is provided. Consistent with an embodiment of the invention, a CMOS semiconductor device having at least one NMOS region and at least one PMOS region is fabricated by forming at least one NMOS gate electrode over a substrate in the NMOS region and at least one PMOS gate electrode over the substrate in the PMOS region. A first n-type dopant is selectively implanted into an NMOS active region of the substrate adjacent the NMOS gate electrode to form a first n-doped region in the NMOS active region. A first NMOS spacer is formed on a sidewall of the NMOS gate electrode and a first PMOS spacer on a sidewall of the PMOS gate electrode. A second n-type dopant is selectively implanted into the NMOS active region using the first NMOS spacer as a mask. The second n-type dopant implant generally forms, in the NMOS active region, a second n-doped region deeper than the first n-doped region. A p-type dopant is selectively implanted into a PMOS active region of the substrate adjacent the PMOS gate electrode using the first PMOS spacer as a mask. This implant forms a first p-doped region in the PMOS active region. A second NMOS spacer and a second PMOS spacer are formed adjacent the first NMOS spacer and first PMOS spacer, respectively. A third n-type dopant is selectively implanted into the NMOS active region using the second NMOS spacer as a mask. This implant forms a third n-doped region deeper than the second n-doped region in the NMOS active region. A second p-type dopant is selectively implanted into the PMOS active region using the second PMOS spacer as a mask. This forms a second p-doped region deeper than the first p-doped region in the PMOS active region. Collectively, three n-doped regions may function as an NMOS source/drain region, while the two p-doped regions may function as a PMOS source/drain region.

A semiconductor device consistent with the invention includes a substrate having at least one NMOS region and at least one PMOS region. At least one NMOS gate electrode is disposed in the NMOS region and at least one PMOS gate electrode is disposed in the PMOS region. Adjacent the NMOS gate electrode, there is disposed an NMOS source/drain region having at least three grades. Adjacent the PMOS gate electrode, there is disposed a PMOS source/drain region having less than three grades.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
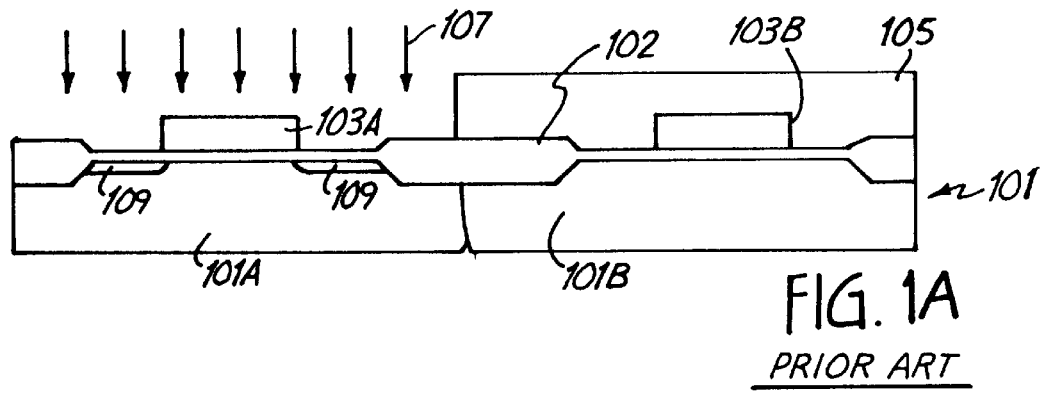
FIGS. 1A–1E illustrate one typical MOS semiconductor device structure.
Figure 1B:
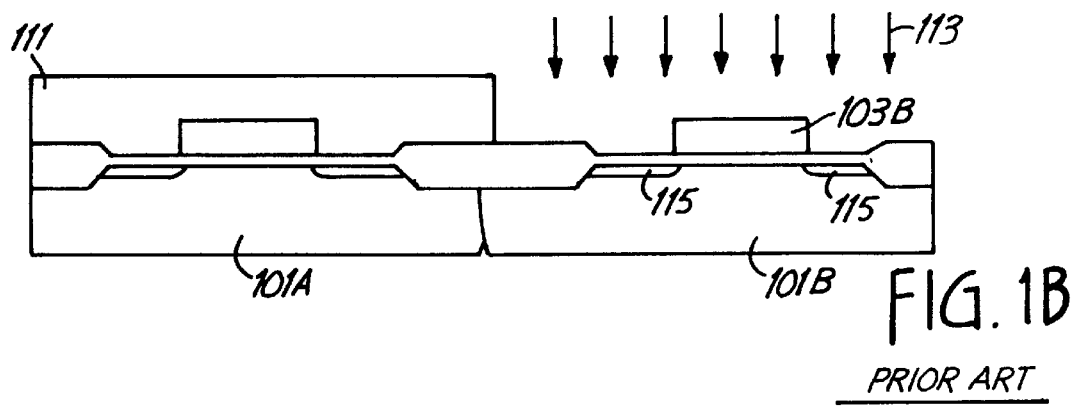
Figure 1C:
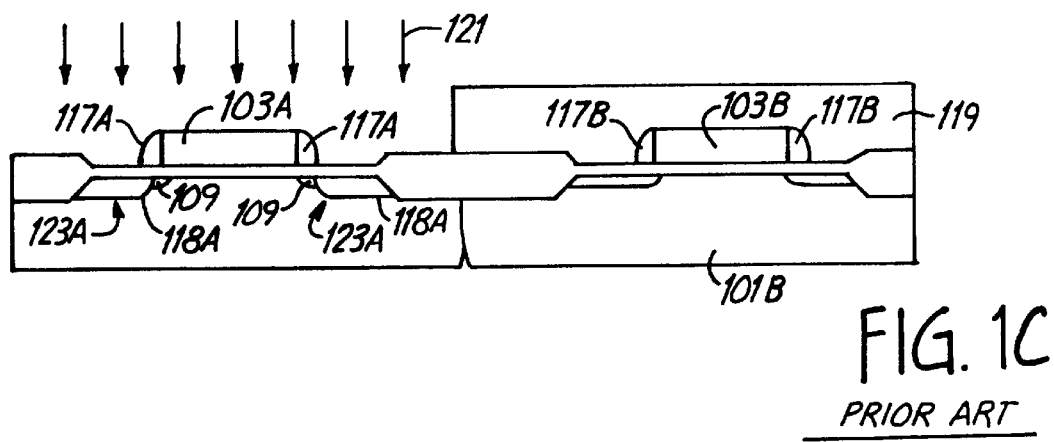
Figure 1D:
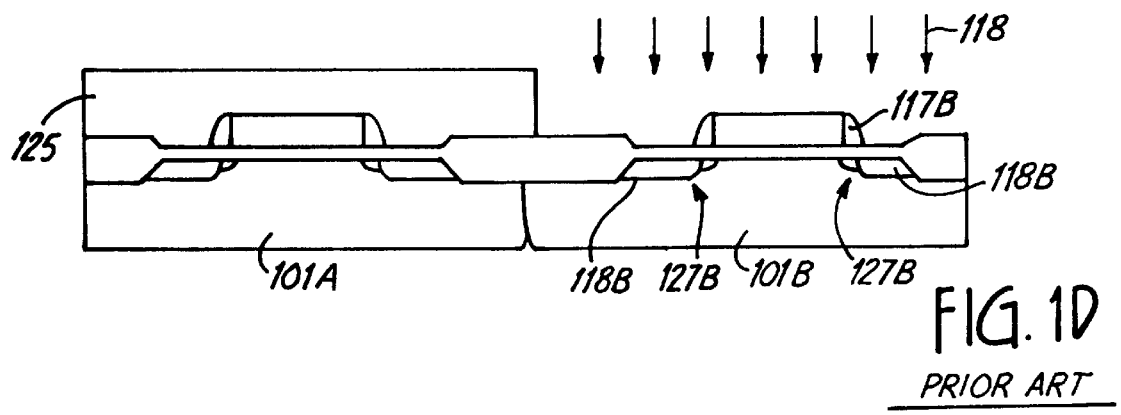
Figure 1E:
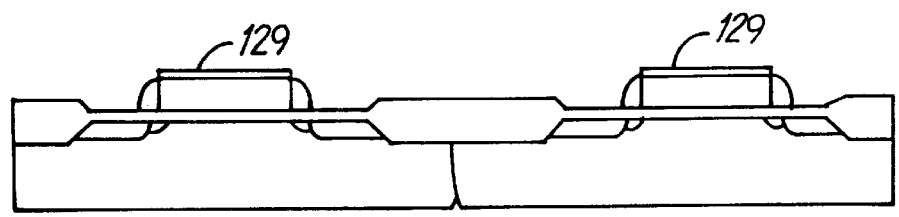

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

Figure 2A:
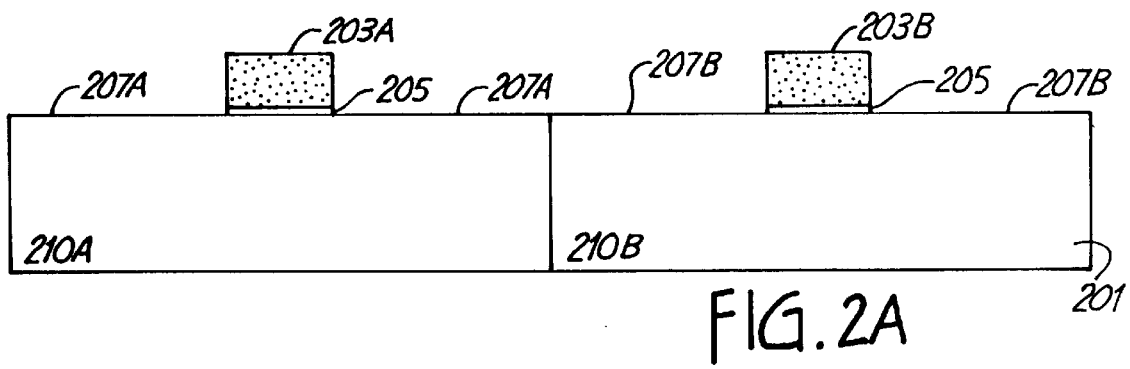
FIGS. 2A–2H illustrate a fabrication process in accordance with one embodiment of the invention.

The present invention is believed to be applicable to a number of semiconductor devices, including in particular MOS structures. While the present invention is not so limited, an appreciation of various aspects of the invention will be gained through a discussion of the fabrication process and characteristics of such a device in connection with the examples provided below. FIGS. 2A–2H illustrate a process for fabricating a CMOS semiconductor device in accordance with one embodiment of the present invention. Using known techniques, NMOS device regions and PMOS device regions are defined and gate electrodes are formed on a substrate 201 (only one gate electrode for each type of channel is shown). As should be appreciated, the NMOS device region 210A and PMOS device region 210B are typically separated by a field region (not shown). The gate electrode 203A in the NMOS device region 210A and the gate electrode 208B in the PMOS device region 210B are each typically insulated from the substrate 201 by a thin oxide layer 205. The resultant structure is illustrated in FIG. 2A. It will be appreciated that a number of different known fabrication techniques could be used to obtain the gate electrode structures depicted in FIG. 2A.

Portions of the semiconductor substrate 201 which lie adjacent the gate electrodes 203A and 203B generally define active regions 207A and 207B of the substrate 201. As used herein, the term active region encompasses a region where an active portion of the device resides whether the active portion has been or will be formed. The active regions 207A and 207B may serve, for example, as source/drain regions of a semiconductor device.

The term device region as used herein refers to a region of the substrate associated with a MOS device having a particular type of channel. The channel type, n-type or p-type, of a channel is identified based on the conductivity type of the channel developed under the transverse electric field. This means that an NMOS device region, for example, includes an n-type channel under a transverse electric field and is associated with n-type doped active regions and gate electrode.

Following formation of the gate electrodes 203A and 203B, a mask 209 is formed to expose regions of the NMOS active regions 207A and typically cover the PMOS device region 210B of the substrate 201. This may, for example, be performed by developing and selectively removing a photoresist. An n-type dopant 208 is then implanted into exposed portions of the NMOS active regions 207A, to form first n-doped regions 211 in the NMOS active regions 207A. The n-type dopant 208 is preferably arsenic (As) since arsenic is a larger atom relative to the silicon lattice than phosphorous (P) and therefore is less mobile in the silicon lattice. This allows greater control of the formation of the region 211.

Figure 2B:
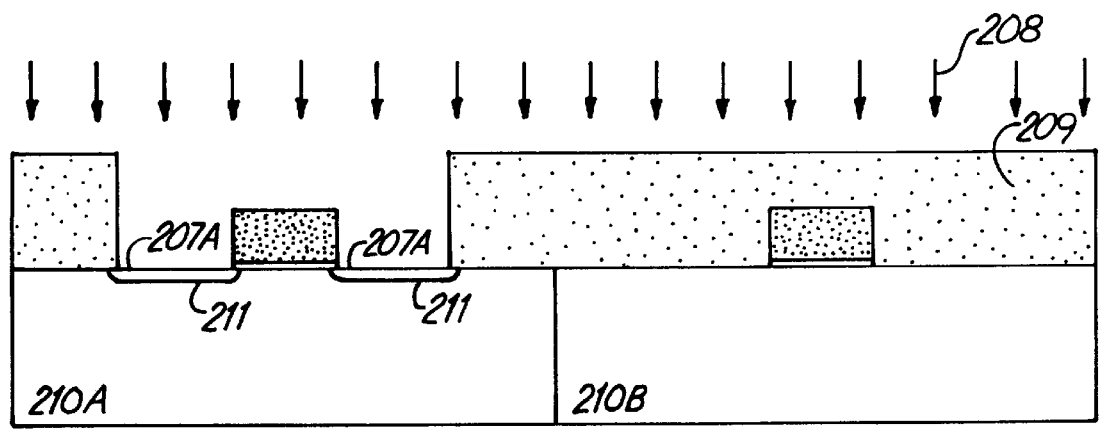
Figure 2C:
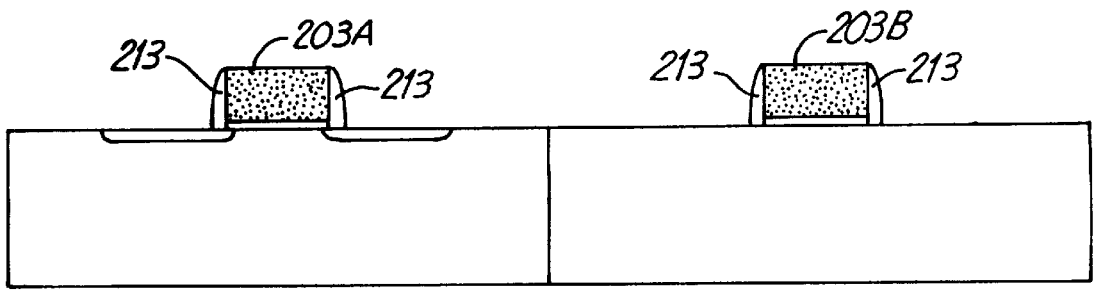

The first n-doped regions 211 are typically shallow, lightly-doped regions used to improve the hot carrier injection resistance of the device. The first n-doped regions 211 also typically define the effective channel length of the device. Implant energies and dopant dosages are selected to optimize the characteristics of the n-doped regions 211. Suitable implant energies and dosages of an As n-type dopant 208 range from about 2 to 20 KeV and 5E14 to 3E15 dopants/cm$^2$, respectively. The resultant structure is depicted in FIG. 2B.

The PMOS mask 209 is removed and spacers 213 are formed on the sidewalls of the gate electrodes 203A and 203B. The spacers 213 are typically formed by forming a spacer layer, such as $SiO_2$ layer, over the substrate 201 and the gate electrodes 203A and 203B and removing portions of the spacer layer to form the spacers 213. Conventional deposition and etching techniques may be used to form the spacers 213. The spacers 213 will be used to space p-type and n-type dopant implants from the gate electrodes 203A and 203B, as will be discussed below. The lateral width of the spacers 213 may be selected in consideration of the desired spacing of the implants. Suitable lateral widths of the spacers 213 range from 200 to 600 angstroms (Å) for many applications.

Figure 2D:
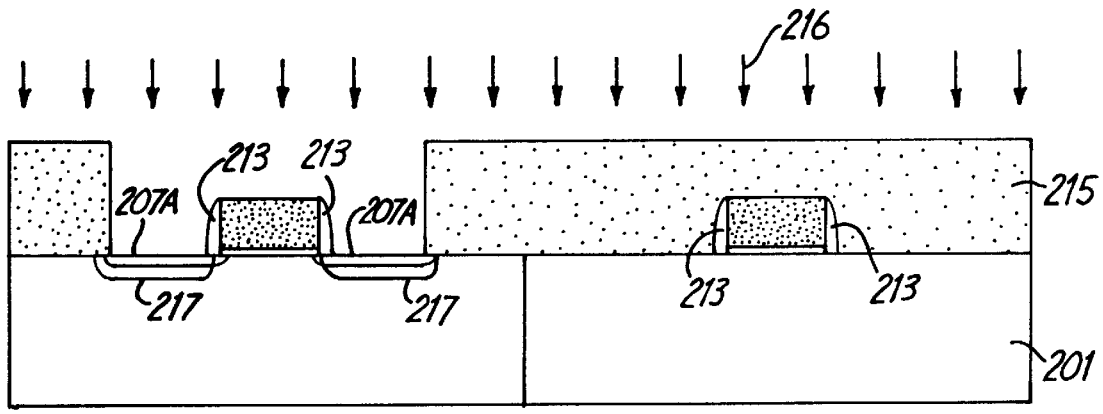

After the spaces 213 are formed, a mask 215 is formed to expose portions of the NMOS active regions 207A and typically cover the PMOS device region 210B of the substrate 201. This may be done, for example, by developing and selectively removing a photoresist. A second implant of an n-type dopant 216 is performed to form second n-doped regions 217 in the NMOS active regions 207A. Suitable n-type dopants include arsenic and phosphorus, for example. The resultant structure is depicted in FIG. 2D.

The second n-doped regions 217 are typically deeper and more heavily-doped than the first n-doped regions 211. The implant energies and dosages of this implant are typically selected to provide the desired depth and resistivity of the n-doped regions 211, while taking into consideration lateral diffusion of the regions 211. In particular, the implant characteristics are selected to prevent the second n-doped regions 217 from laterally diffusing beyond the first n-doped regions 211. Typically, the implant energies and dosages are less than the implant energies and dosages used to form heavily doped n-type regions in conventional LDD fabrication processes like those discussed earlier. Suitable implant energies and dosages of an As n-type dopant 216 range from about 10 to 20 KeV and 2E15 to 3E15 dopants/cm$^2$, respectively, for many applications.

Figure 2E:
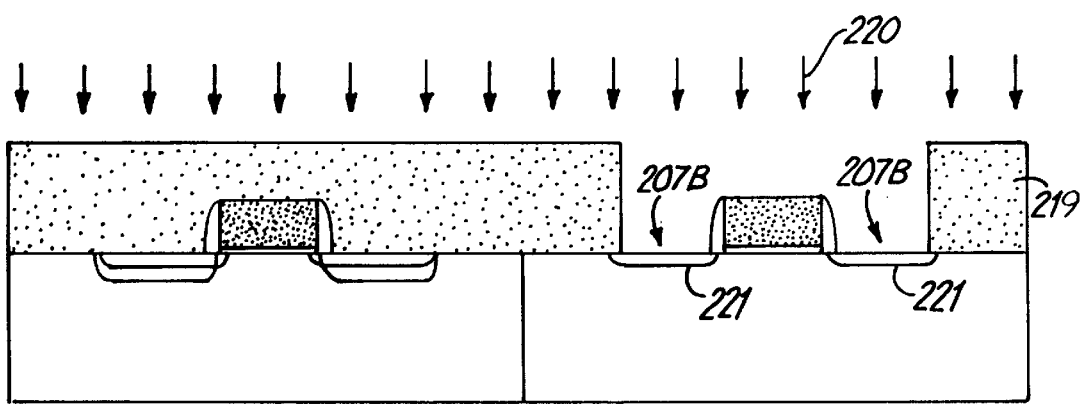

The PMOS mask 215 is removed and a mask 219 is formed to expose portions of the PMOS active regions 207B and typically cover the NMOS device region 210A of the substrate 201. This may be done, for example, by developing and selectively removing a photoresist using conventional techniques. The exposed portions of the PMOS active regions 207B are then implanted with a p-type dopant 220 to form a first p-type doped regions 221 in the PMOS active regions 207B, as illustrated in FIG. 2E. Suitable p-type dopants 220 include boron-containing species, such as $BF_2$ or B, for example.

The first p-doped regions 221 are typically shallow, lightly-doped regions used to improve the hot carrier injection resistance of the device. The first p-doped regions 221 also typically define the effective channel length of the device. Implant energies and dopant dosages are selected to optimize the characteristics of the p-doped regions 221. Suitable implant energies and dosages of a $BF_2$ p-type dopant range from about 2 to 20 KeV and 5e14 to 3E15 atoms/cm$^2$, respectively, for many applications. The resultant structure is illustrated in FIG. 2E.

After removing mask 215 and prior to forming mask 219, the substrate 201 may be heated using, for example, a rapid thermal anneal (RTA) process. The heating generally serves to activate the n-type dopants in the first and second n-doped regions 211 and 217. One exemplary heat treatment includes an RTA process at 1050 to 1075° C. for 30 seconds.

The NMOS mask 219 is removed and additional spacers 223 are formed on the sidewalls of the gate electrodes 203A and 203B. The spacers 223 may be formed using conventional deposition and etching techniques in a similar manner as discussed above. While the spacers 223 and 207 are illustrated separately in FIG. 2F, it should be appreciated that when formed of the same material, the spacers 223 and 207 will generally blend together. The spacers 223 are used to further space p-type and n-type dopant implants from the gate electrodes 203A and 203B, as will be discussed below. The lateral width of the spacers 223 may be selected in consideration of the desired spacing of the implants. Suitable lateral spacer 223 widths for many applications range from 500 to 1500 Å. This provides a composite spacer width (i.e., the combined width of spacers 223 and 207) of about 700 to 2100 Å.

Figure 2F:
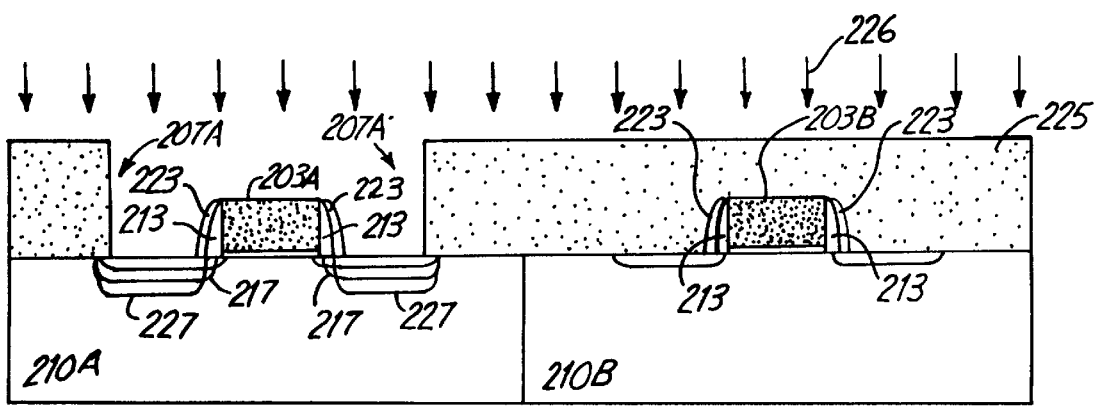

A mask 225 is formed to expose portions of the NMOS active regions 207A of the substrate 201 and typically cover the PMOS device region 210B using, for example, conventional photolithography techniques. A third implant of an n-type dopant 226 (e.g., As or P) is performed to form third n-doped regions 227 in the NMOS active region 207A. The resultant structure is depicted in FIG. 2F. The third n-doped regions 227 are typically deeper than the second n-doped regions 217. The implant energies and dosages of this implant are typically selected in consideration of the desired depth and resistivity of the regions 227. The depth is typically selected in consideration of the desired depth of a subsequently formed silicide layer. Suitable implant energies and dosages for an As n-type dopant 226 range from about 40 to 50 KeV and 3E15 to 4E15 dopants/cm$^2$, respectively, for many applications.

Figure 2G:
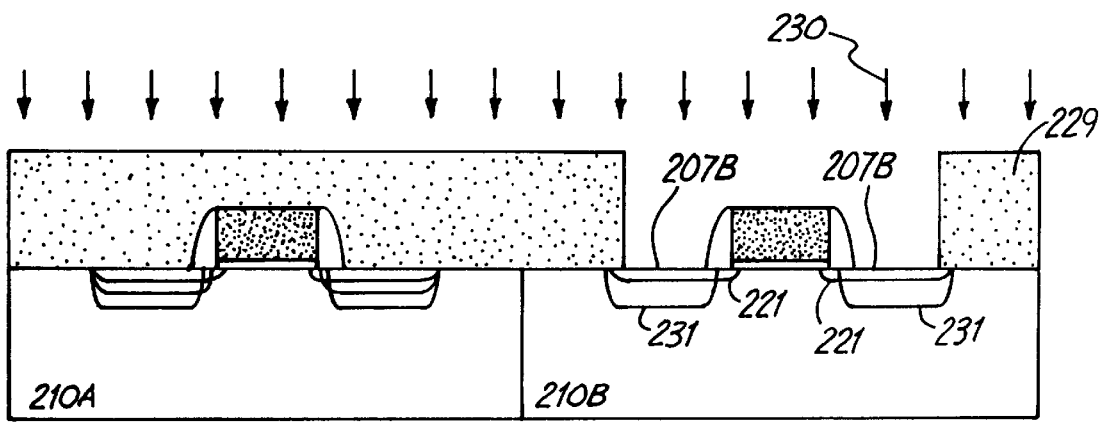

The PMOS mask 225 is removed and a mask 229 is formed to expose portions of the PMOS active regions 207B and typically cover the NMOS device region 210A of the substrate 201 using, for example, conventional photolithography techniques. The exposed portions of the PMOS active region 207B are then implanted with a p-type dopant 230 (e.g., $BF_2$ or B) to form second p-type doped regions 231 in the PMOS active regions 207B. The resultant structure is illustrated in FIG. 2G. The second p-doped regions 231 are typically deeper and more conductive than the first p-doped regions 217. The implant energies and dosages of the p-type dopant 230 implant are typically selected in consideration of the desired depth and resistivity of the regions 231. The resistivity of the regions 231 is typically selected to optimize device performance, while the depth is typically selected in consideration of the desired depth of a subsequently formed silicide layer. Suitable implant energies and dosages of a $BF_2$ p-type dopant 230 range from about 40 to 50 KeV and 3E15 to 4E15 dopants/$cm^2$, respectively, for many applications.

Figure 2H:
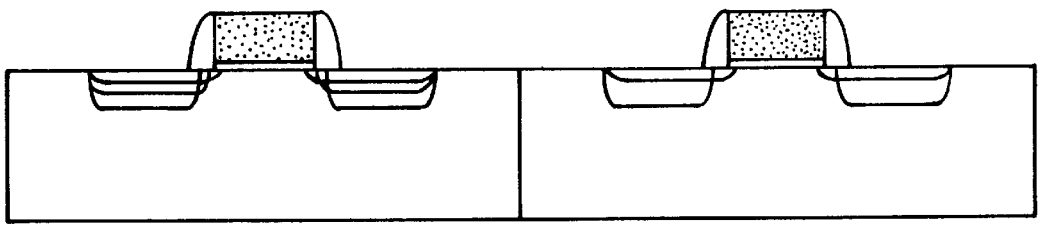

The NMOS mask 229 may be removed, as illustrated in FIG. 2H. At this point, the substrate 201 is typically subjected to heat treatment, such as an RTA process, in order to activate the newly implanted n-type dopants 226 in the third n-doped regions 227 as well as the implanted p-type dopants 220 and 230 in the p-doped regions 221 and 231. This heat treatment is usually performed at reduced temperatures as compared to the earlier heat treatment. One exemplary heat treatment is an RTA process at about 1000° C. for 30 seconds, for example. Processing may continue with well-known fabrication steps, such as silicidation and contact formation, to complete the device structure.

Using the above process, multiple implants at different spacings from a gate electrode can be used, for example, to form an NMOS source/drain region. Greater control over the profile of the NMOS source/drain region is provided as compared to conventional implant techniques. Moreover, NMOS source/drain regions with minimal and highly controlled encroachment of the gate channel can be formed. This enhances transistor performance by, for example, reducing source-to-drain interactions, reducing off-state leakage, and reducing capacitance.

Moreover, the above process allows the formation of such NMOS source/drain regions while integrating PMOS source/drain regions. In particular, the above-process allows tight control over the formation of such PMOS LDD source/drain regions by integrating the formation such as PMOS-LDD regions with minimal heat treatment. For example, in the above process, the first and second n-doped regions are activated prior to the formation of the first p-doped region. This allows the heat treatment and profile of the NMOS and PMOS source/drain regions to be more precisely controlled than those formed using conventional techniques.

While the above process is illustrated in conjunction with a CMOS device, the process is not so limited. The above processes can be used to form a number of different semiconductor devices, including but not limited to MOS structures such as PMOS devices, NMOS devices, and CMOS devices having both PMOS and NMOS devices. For example, in NMOS or PMOS devices, the processing techniques illustrated above with respect to the NMOS device region 210A may be performed to form n-LDD or p-LDD source/drain regions.

As noted above, the present invention is applicable to the fabrication of a number of different devices where NMOS source/drain regions are formed using multiple spacers. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of fabricating a CMOS semiconductor device having at least one NMOS region and at least one PMOS region, comprising:

(a) forming at least one NMOS gate electrode over a substrate in the NMOS region and at least one PMOS gate electrode over the substrate in the PMOS region;

(b) selectively implanting a first n-type dopant into an NMOS active region of the substrate adjacent the NMOS gate electrode to form a first n-doped region in the NMOS active region;

(c) forming a first NMOS spacer on a sidewall of the NMOS gate electrode and a first PMOS spacer on a sidewall of the PMOS gate electrode;

(d) selectively implanting a second n-type dopant into the NMOS active region using the first NMOS spacer as a mask, the second n-type dopant implant forming, in the NMOS active region, a second n-doped region deeper than the first n-doped region and then heating the substrate at a first temperature;

(e) after heating the substrate, selectively implanting a p-type dopant, using the first PMOS spacer as a mask, the into a PMOS active region of the substrate adjacent the PMOS gate electrode to form a first p-doped region in the PMOS active region;

(f) forming a second NMOS spacer and a second PMOS spacer adjacent the first NMOS spacer and first PMOS spacer; and (g) selectively implanting a third n-type dopant, using the second NMOS spacer as a mask, into the NMOS active region to form a third n-doped region deeper than the second n-doped region in the NMOS active region; and (h) selectively implanting a second p-type dopant, using the second PMOS spacer as a mask, into the PMOS active region to form a second p-doped region deeper than the first p-doped region in the PMOS active region and then heating the substrate at a second temperature after implanting the third n-type dopant and the first and second p-type dopants, wherein the second temperature is lower than the first temperature.

2. The process of claim 1, wherein the process is performed in an order of (a), (b), (c), (d), (e), (f), (g) then (h).

3. The process of claim 1, wherein selectively implanting the first n-type dopant includes:

forming a masking layer over the substrate; and selectively removing a portion of the masking layer to expose the NMOS active region.

4. The process of claim 1, wherein forming the first NMOS spacer and first PMOS spacer includes:

forming a spacer layer over the PMOS and NMOS regions of the substrate;

removing portions of the spacer layer.

5. The process of claim 1, wherein selectively implanting the second n-type dopant includes:

forming a masking layer over the substrate; and selectively removing a portion of the masking layer to expose the NMOS active region.

6. The process of claim 5, wherein selectively implanting the first p-type dopant includes:

removing a remaining portion of the masking layer;

forming a second masking layer over the substrate; and selectively removing a portion of the second masking layer to expose the PMOS active region.

7. The process of claim 6, wherein selectively implanting the third n-type dopant includes:

removing a remaining portion of the second masking layer;

forming a third masking layer over the substrate; and selectively removing a portion of the third masking layer to expose the NMOS active region.

8. The process of claim 7, wherein selectively implanting the second p-type dopant includes:

removing a remaining portion of the third masking layer;

forming a fourth masking layer over the substrate; and selectively removing a portion of the fourth masking layer to expose the PMOS active region.

9. The process of claim 1, wherein the first n-type dopant is implanted at a first energy level and first dopant dosage.

10. The process of claim 9, wherein the second n-type dopant is implanted at a second energy level greater than the first energy level.

11. The process of claim 10, wherein the second n-type dopant is implanted at a second dopant dosage about equal to the first dopant dosage.

12. The process of claim 10, wherein the third n-type dopant is implanted at a third energy level greater than the second energy level.

13. The process of claim 12, wherein the third n-type dopant is implanted at a third dopant dosage greater than the first dopant dosage.

14. The process of claim 1, wherein the first n-type dopant is arsenic.

15. The process of claim 14, wherein at least one of the second and third n-type dopants is arsenic.

16. The process of claim 14, wherein at least one of the second and third n-type dopants is phosphorous.

17. The process of claim 1, wherein the active region functions a source/drain region.

18. A process of fabricating a CMOS semiconductor device having at least one NMOS region and at least one PMOS region, comprising:

(a) forming at least one NMOS gate electrode over a substrate in the NMOS region and at least one PMOS gate electrode over the substrate in the PMOS region;

(b) selectively implanting a first n-type dopant into an NMOS active region of the substrate adjacent the NMOS gate electrode to form a first n-doped region in the NMOS active region;

(c) forming a first NMOS spacer on a sidewall of the NMOS gate electrode and a first PMOS spacer on a sidewall of the PMOS gate electrode;

(d) selectively implanting a second n-type dopant into the NMOS active region using the first NMOS spacer as a mask, the second n-type dopant implant forming, in the NMOS active region, a second n-doped region deeper than the first n-doped region;

(e) heating the substrate at a first temperature after implanting the first and second n-type dopants and prior to implanting any p-type dopants;

(f) selectively implanting a p-type dopant, using the first PMOS spacer as a mask, the into a PMOS active region of the substrate adjacent the PMOS gate electrode to form a first p-doped region in the PMOS active region;

(g) forming a second NMOS spacer and a second PMOS spacer adjacent the first NMOS spacer and first PMOS spacer;

(h) selectively implanting a third n-type dopant, using the second NMOS spacer as a mask, into the NMOS active region to form a third n-doped region deeper than the second n-doped region in the NMOS active region;

(i) selectively implanting a second p-type dopant, using the second PMOS spacer as a mask, into the PMOS active region to form a second p-doped region deeper than the first p-doped region in the PMOS active region; and (j) heating the substrate at a second temperature after implanting the third n-type dopant and the first and second p-type dopants, wherein the second temperature is lower than the first temperature.

* * * * *